(12) United States Patent
Wei et al.

(10) Patent No.: US 10,998,225 B2
(45) Date of Patent: May 4, 2021

(54) SEMICONDUCTOR DEVICE AND METHOD OF FORMING THE SAME

(71) Applicant: TAIWAN SEMICONDUCTOR MANUFACTURING COMPANY LTD., Hsinchu (TW)

(72) Inventors: Tzu-Hui Wei, Hsinchu County (TW); Chien-Hua Huang, Miaoli County (TW); Cherng-Shiaw Tsai, New Taipei (TW); Chung-Ju Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 102 days.

(21) Appl. No.: 16/249,440

(22) Filed: Jan. 16, 2019

(65) Prior Publication Data

US 2020/0135548 A1    Apr. 30, 2020

Related U.S. Application Data

(60) Provisional application No. 62/751,079, filed on Oct. 26, 2018.

(51) Int. Cl.
| | | |
|---|---|---|
| *H01L 21/768* | (2006.01) | |
| *H01L 21/02* | (2006.01) | |
| *H01L 21/3115* | (2006.01) | |
| *H01L 23/522* | (2006.01) | |

(52) U.S. Cl.
CPC .. *H01L 21/76829* (2013.01); *H01L 21/02178* (2013.01); *H01L 21/3115* (2013.01); *H01L 21/76802* (2013.01); *H01L 21/76822* (2013.01); *H01L 21/76877* (2013.01); *H01L 23/5226* (2013.01)

(58) Field of Classification Search
CPC ......... H01L 21/02321; H01L 21/31111; H01L 21/0234; H01L 21/02348; H01L 21/76802; H01L 21/76877; H01L 21/76822; H01L 23/5226; H01L 21/3115; H01L 21/02178; H01L 21/76829; H01L 21/76834; H01L 21/76811; H01L 21/76825; H01L 21/76828
See application file for complete search history.

(56) References Cited

U.S. PATENT DOCUMENTS

2005/0001318 A1*    1/2005    Won ................... H01L 27/14636
                                                          257/751

* cited by examiner

*Primary Examiner* — Jasmine J Clark
(74) *Attorney, Agent, or Firm* — WPAT, P.C., Intellectual Property Attorneys; Anthony King

(57) ABSTRACT

The present disclosure provides a method for forming a semiconductor device. The method includes providing a substrate having a metal pattern, and forming an etch stop layer over the substrate. The etch stop layer includes a first material. The method also includes forming a diffused area in the etch stop layer by diffusing a second material from the metal pattern to the etch stop layer, and forming an insulative layer over the etch stop layer. The diffused area includes a lower etch rate to a first etchant than the insulative layer. A semiconductor device is also provided.

20 Claims, 19 Drawing Sheets

US 10,998,225 B2

SEMICONDUCTOR DEVICE AND METHOD OF FORMING THE SAME

CROSS REFERENCE TO RELATED APPLICATIONS

This application claims the benefit of prior-filed provisional application No. 62/751,079, filed Oct. 26, 2018, which is incorporated by reference in its entirety.

BACKGROUND

Via etching process employed in certain integrated circuit (IC) manufacturing processes has adopted an aluminum oxide film as an etch stop layer which is subsequently removed by wet etching or dry etching. To properly remove the $Al_2O_3$ by wet etching, an undercut equal to the thickness of the $Al_2O_3$ results. This poses a problem for reliability and yield in the subsequent gap filling process. On the other hand, removing an etch stop layer by dry etching often causes damage to the metal underneath the etch stop layer, which may also lead to reliability issue and high $R_c$.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
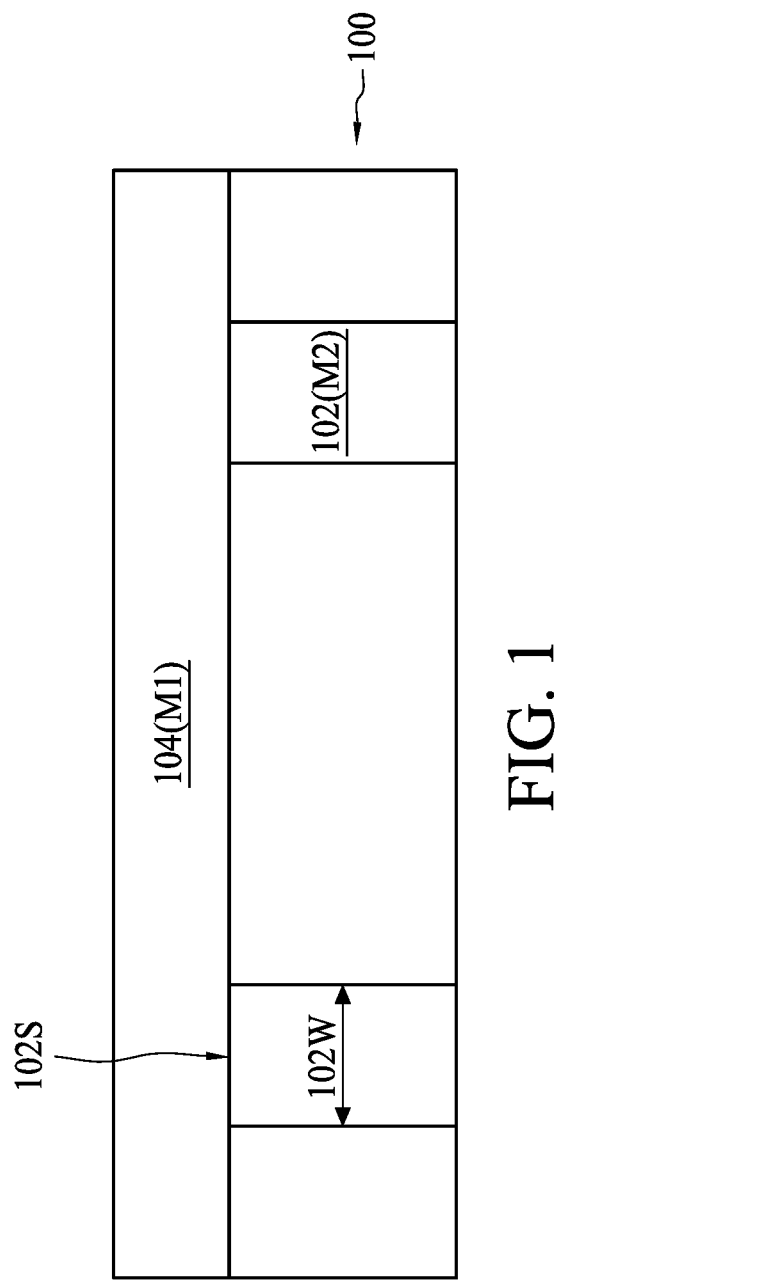
FIG. 1 to FIG. 9 illustrate a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to FIG. 1 to FIG. 9, FIG. 1 to FIG. 9 illustrate a method 200 of forming a semiconductor device in accordance with some embodiments of the present disclosure. The method 200 described in FIG. 1 to FIG. 9 proceed in accordance with the steps set forth in the flow chart of FIG. 10.

The method 200 begins at step 202, where a substrate having a metal pattern is provided. With reference now to FIG. 1, there is shown a cross-sectional diagram of a substrate 100 having a metal pattern 102.

The metal pattern 102 includes a material M2. In various examples, the material M2 includes copper (Cu), cobalt (Co), ruthenium (Ru), tungsten (W), rhodium (Rh), molybdenum (Mo), or other suitable metal or alloy thereof. The substrate 100 is typically dielectrics, such as silicon oxide or silicon (Si). In various examples, the substrate 100 may also include gallium arsenide (GaAs), gallium arsenide-phosphide (GaAsP), indium phosphide (InP), gallium aluminum arsenic (GaAlAs), indium gallium phosphide (InGaP), and the like.

In some embodiments, the metal pattern 102 may be deposited in the substrate 100 by electrical chemical plating (ECP), physical vapor deposition (PVD), chemical vapor deposition (CVD), atomic layer deposition (ALD), vacuum evaporation, sputtering or other method known in the art. A planarization procedure may be subsequently applied to surface 102S of the metal pattern 102. In some embodiments, the surface 102S have a width 102W. In some embodiments, the surface 102S is coplanar with the surface of the substrate 100.

The method 200 then proceeds to step 204, forming an etch stop layer over the substrate. As shown in FIG. 1, an etch stop layer 104 is formed over the substrate 100. The etch stop layer 104 contacts with the surface 102S of the metal pattern 102.

The etch stop layer 104 includes a material M1. In various examples, the material M1 includes aluminum oxide ($AlO_x$), aluminum oxynitride (AlON), aluminum oxycarbide (AlOC), oxygen-doped silicon carbide (ODC), silicon carbide (SiC), hafnium oxide ($HfO_x$), titanium oxide ($TiO_x$), manganese oxide ($MnO_x$), vanadium oxide ($VO_x$), or other suitable materials.

In some embodiments, the etch stop layer 104 may be deposited over the substrate 100 by PVD, chemical vapor deposition (CVD), atomic layer deposition (ALD), thermal ALD, spin-on coating, or other method known in the art. In some embodiments, the etch stop layer 104 may be deposited to a thickness about 20 Å to 80 Å. In some embodiments, the etch stop layer 104 may be deposited to a thickness not greater than 60 Å.

Figure 2:
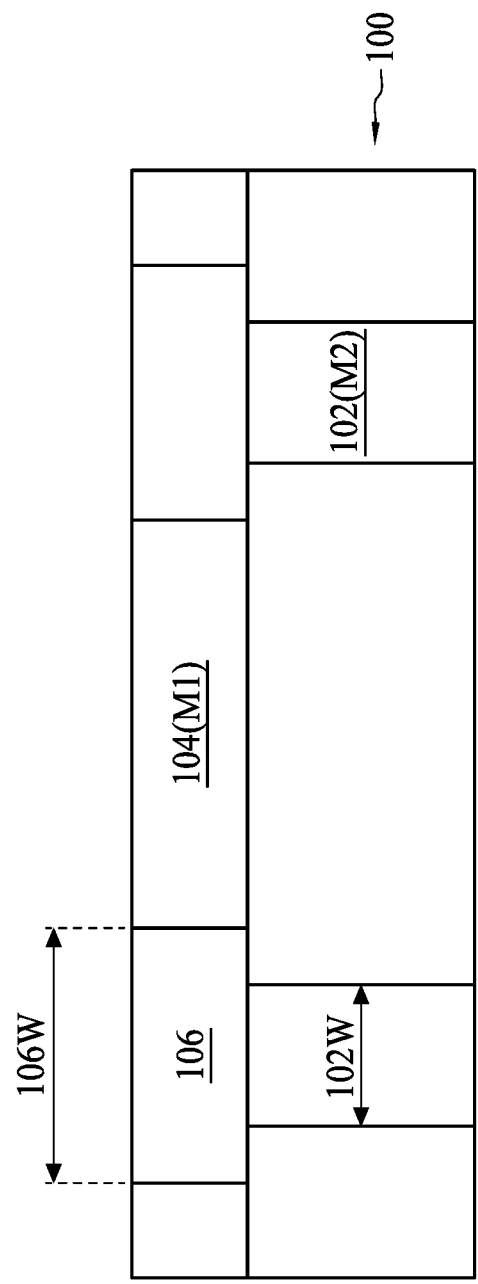

The method 200 then proceeds to step 206, forming a diffused area in the etch stop layer. As shown in FIG. 2, the diffused area 106 is formed in the etch stop layer 104 by diffusing the material M2 from the metal pattern 102 into the etch stop layer 104.

The material M2 reacts with the material M1 of the etch stop layer 104 to form a compound and therefore, to constitute the diffused area 106. The diffused area 106 also grows laterally, which is perpendicular to the direction along which the etch stop layer 104 stacks on the metal pattern 102. For example, the compound constituting the diffused area 106 includes $Al(Cu)O_x$ when the material M1 is aluminum oxide ($AlO_x$) and the material M2 is copper (Cu).

The diffused area 106 has a lower etch rate to a first etchant used in step 210 (described with reference to FIG. 6 below) than the non-diffused area of the etch stop layer 104.

In some embodiments, the diffused area 106 is formed in the etch stop layer 104 by treating the metal pattern 102 with ultraviolet (UV) light or heat. In some embodiments, the concentration of the diffused area 106 is graded. For example, the closer to the metal pattern 102, the higher the concentration is. In some embodiments, the concentration of the diffused area 106 is substantially uniform.

In some embodiments, the diffused area 106 may be formed by utilizing mercury vapor lamp, fluorescent lamps, LEDs, tanning lamps, halogen lamps, gas-discharge lamps, excimer lamps, or other light source known in the art. In some embodiments, the UV light that may be used to diffuse the material M2 has a wavelength about 100 to 500 nm. In some embodiments, the UV light dosage is 0.05 to 100 $J/cm^2$.

In some embodiments, the diffused area 106 may be formed by baking the etch stop layer 104 and the substrate 100 in an ambient containing hydrogen ($H_2$) and/or an inert gas (such as helium (He), nitrogen ($N_2$), and argon (Ar)). In some embodiments, the baking time is about 6 to 20 minutes. In some embodiments, the baking time is shorter than 10 minutes. In some embodiments, the heat for diffusing the material M2 is about 350 to 450° C. In some embodiments, the heat is not greater than 400° C.

In some embodiments, the etch stop layer 104 includes the diffused area 106 and the non-diffused area. The diffused area 106 includes material M2, which also exists in the metal pattern 102. The non-diffused area is defined as an area free of the material M2. In other words, the non-diffused area is remained as the original material M1 after the diffusing process.

The diffused area 106 has a width 106W, which is defined as the farthest boundary where the material M2 diffused. In some embodiments, the width 106W is wider than the width 102W of the surface 102S of the metal pattern 102. In some embodiments, the diffused area 106 covers up the surface 102S of the metal pattern 102. In some embodiments, the non-diffused area does not contact with the surface 102S.

In some embodiments, the material M2 is diffused to form two diffused areas 106, and the two diffused areas 106 are separated by the non-diffused area. In some embodiments, multiple diffused areas 106 are intervally formed in the etch stop layer 104. In some embodiments, the multiple diffused areas 106 are surrounded by the non-diffused area.

In an embodiment where there are multiple surfaces 102S of the metal pattern 102, the multiple surfaces 102S are covered by multiple diffused areas 106 respectively.

Figure 3:
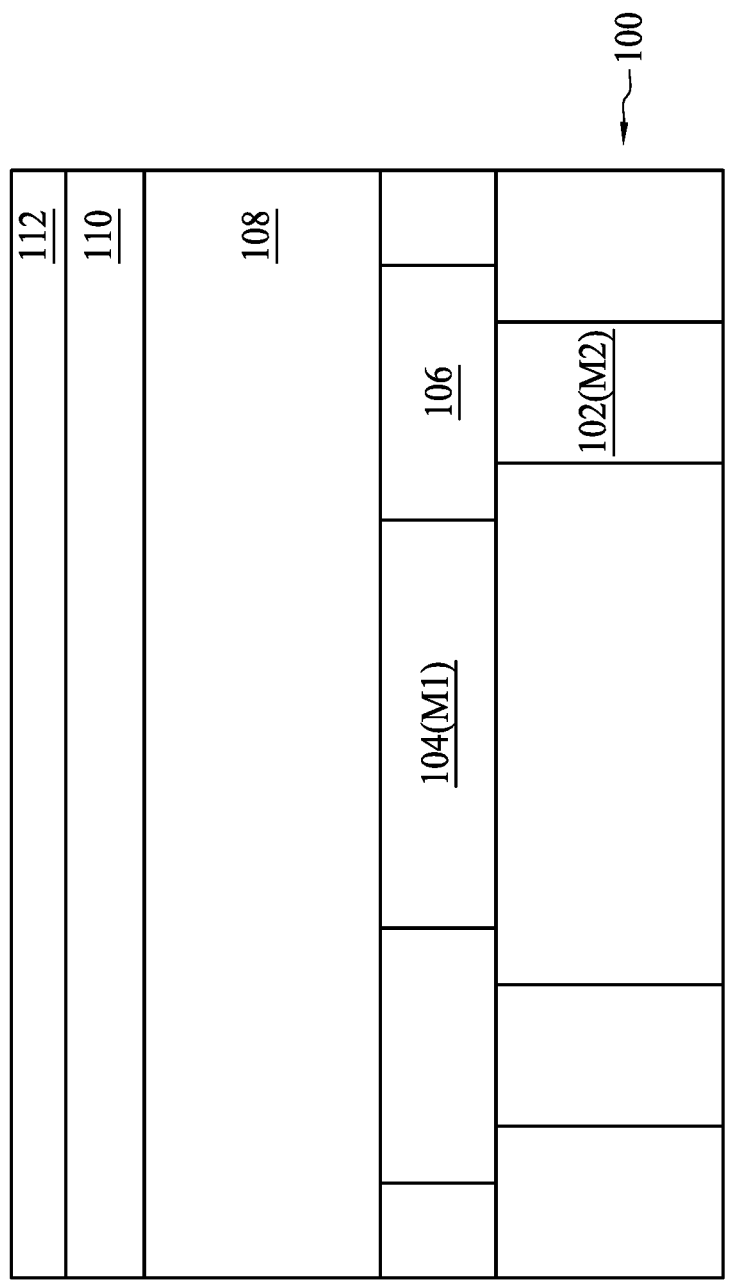

The method 200 then proceeds to step 208, forming an insulative layer over the etch stop layer. FIG. 3 illustrates the insulative layer 108 deposits over the etch stop layer 104.

The etch stop layer 104 is between the insulative layer 108 and the substrate 100. The diffused area 106 contacts with the insulative layer 108 at a surface and contacts with the substrate 100 at an opposite surface.

In various examples, the insulative layer 108 includes dielectric materials such as polyimide, benzocyclobutene (BCB), polybenzoxazole (PBO), silicon nitride (SiN), silicon carbide (SiC), silicon oxide (SiO), silicon oxynitride (SiON), or other suitable materials. In various examples, the insulative layer 108 includes low-k dielectrics such as carbon doped oxides, extremely low-k dielectrics such as porous carbon doped silicon dioxide, or other suitable materials.

In some embodiments, the insulative layer 108 may be deposited by CVD, high density plasma CVD (HDPCVD), plasma enhanced CVD (PECVD) or other method known in the art.

In some embodiments, atop the insulative layer 108 is an anti-reflective coating (ARC) layer 110. In various examples, dependent on the wavelength of the light source using in subsequent exposure process, the material of the ARC layer 110 may be a double film of titanium and titanium nitride (Ti/TiN) for I-line source, and silicon oxynitride (SiON) for deep ultra-violet (DUV) ray. The double film of Ti/TiN can be formed by a titanium sputtering followed by a nitridation or formed by titanium deposition followed by a titanium nitride sputtering. The silicon oxynitride (SiON) can be formed by PECVD, low-pressure CVD (LPCVD) or by heating the silicon oxide in a NO or $N_2O$ ambient. The ARC layer 110 typically absorbs light, thereby minimizing reflection form reflective surface.

In some embodiments, a hardmask 112 is formed on the ARC layer 110. In various examples, the hardmask 112 includes silicon nitride (SiN), silicon oxynitride (SiON). Other hard mask materials include phosphosilicate glass (PSG), borophosphosilicate (BPSI), silicon oxynitride, thermally grown silicon dioxide, or other suitable materials. The hardmask 112 can be formed using any suitable technique, such as CVD, LPCVD or PECVD.

Figure 4:
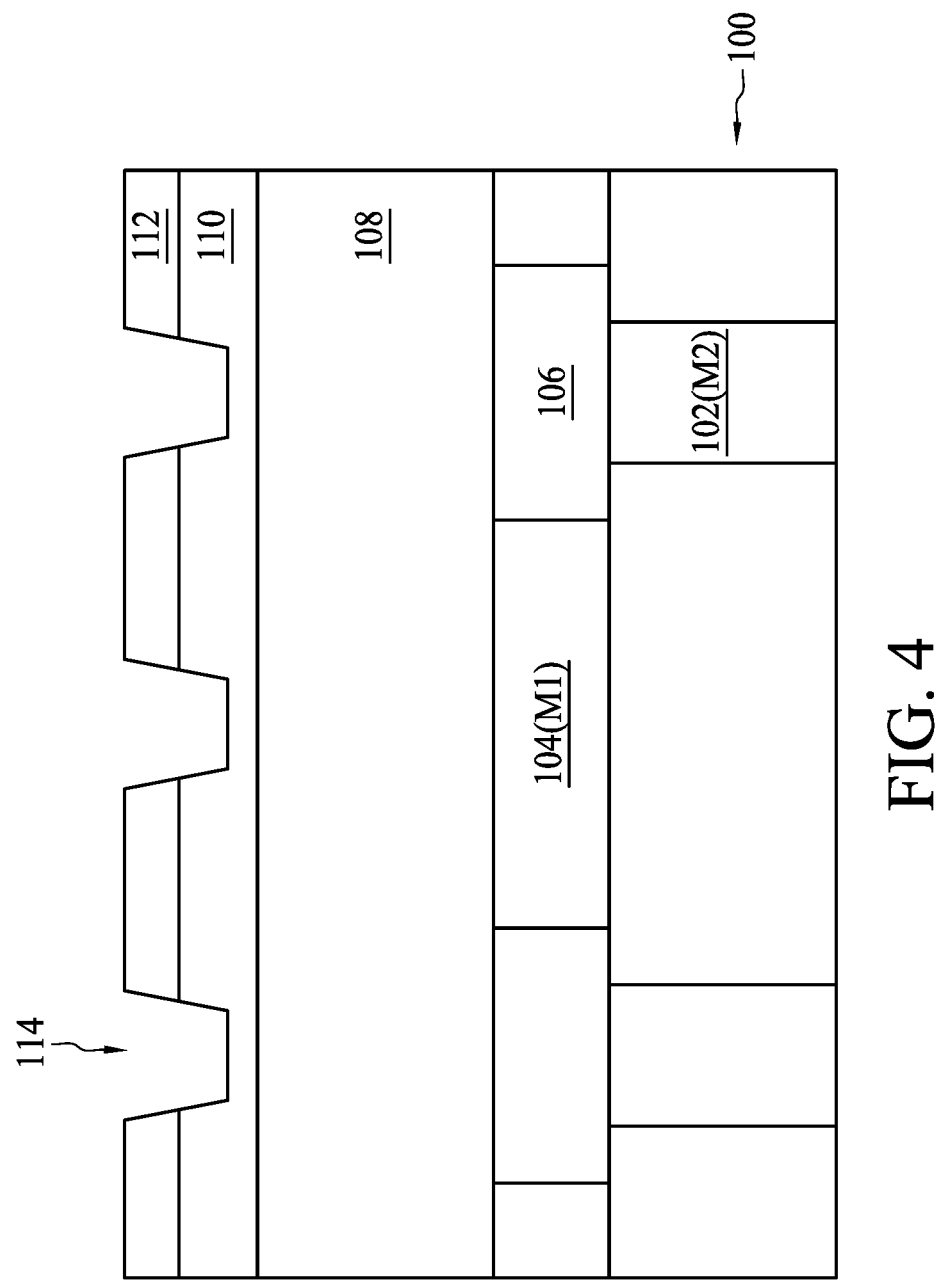

In some embodiments, as shown in FIG. 4, the hardmask 112 is patterned by using a standard method of photolithography. For example, the hardmask 112 is patterned by photoresist coating, exposure and development process. The patterned hardmask 112 has openings of plug 114, including the contact plug and the via plug. The contact plug is a shallow opening, and the via plug will be developed to a through hole that penetrating the insulative layer 108. In the illustrated example in FIG. 4, the contact plug is in the middle, and the via plugs are at both sides.

Figure 5:
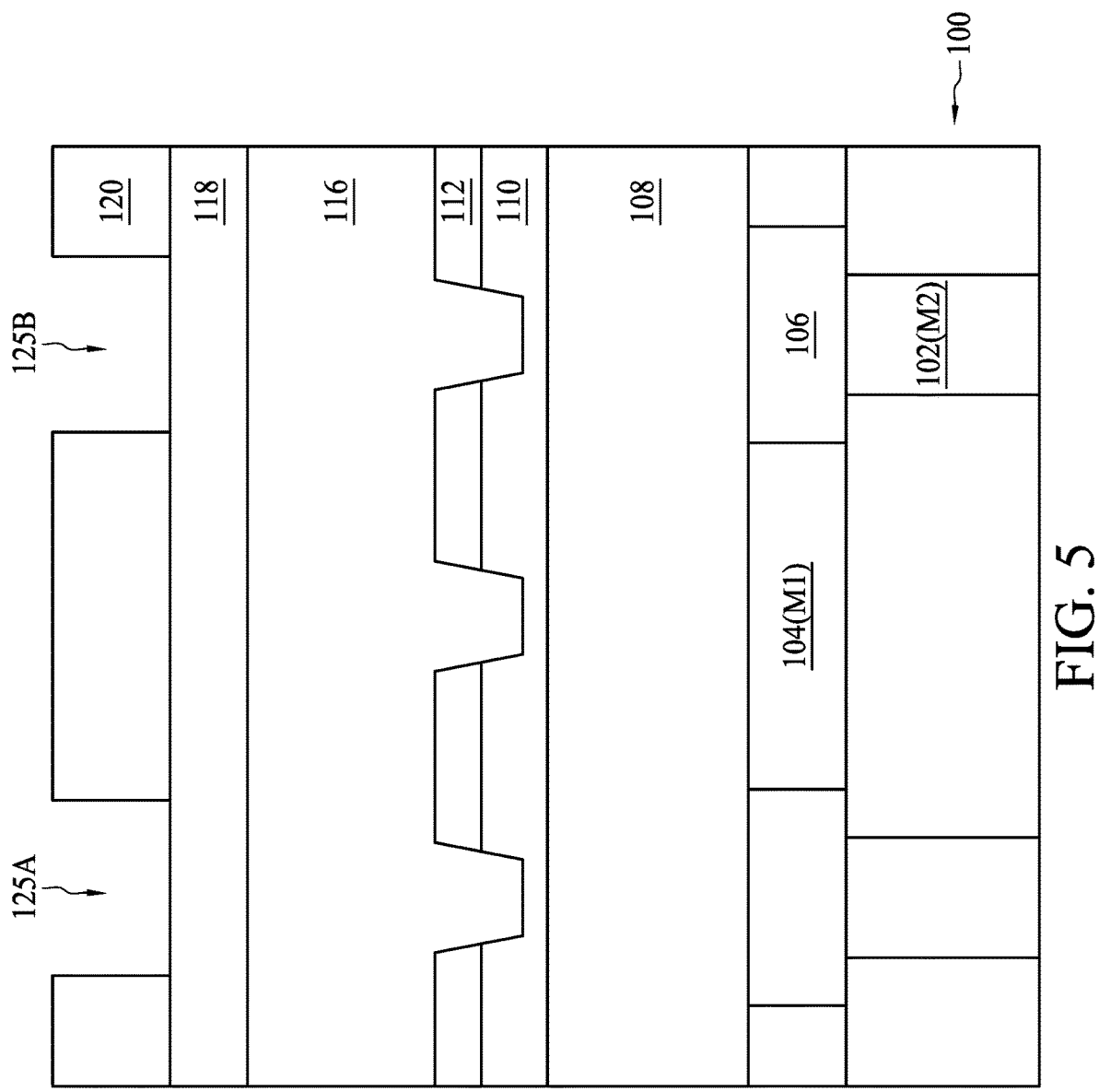

The method 200 then proceeds to step 210, forming a through hole in the insulative layer to exposing a portion of the diffused area. In some embodiments, as shown in FIG. 5, a photoresist 120 is formed and patterned to define the through holes 125A and 125B in the insulative layer 108.

It is known in the art that photoresist layers may be formed from photoresist materials including, but not limited to, positive photoresist materials and negative photoresist materials. In the illustrated example in FIG. 5, the photoresist 120 is formed from a positive photoresist material such as, but not limited to, a novolak positive photoresist material or a poly-methyl-meth-acrylate (PMMA) positive photoresist material.

In some embodiments, a process involving forming a bottom resist 116 by spin coating for planarization purpose, and forming a middle resist 118 by a CVD technique is carried out. In some embodiments, the bottom resist 116 and middle resist 118 may be formed by other method known in the art. In various examples, the middle resist 118 may have a composition that provides an anti-reflective properties and/or hard mask properties for the photolithography process of the photoresist 120.

In some embodiments, the middle resist 118 includes silicon, silicon-containing inorganic polymer, siloxane polymer, or other suitable materials. Alternatively, the middle resist 118 may include silicon oxide (e.g., spin-on glass (SOG)), silicon nitride (SiN), silicon oxynitride (SiON), polycrystalline silicon, or a metal-containing organic polymer material, which contains metal such as titanium (Ti), titanium nitride (TiN), aluminum (Al), and tantalum (Ta).

Figure 6:
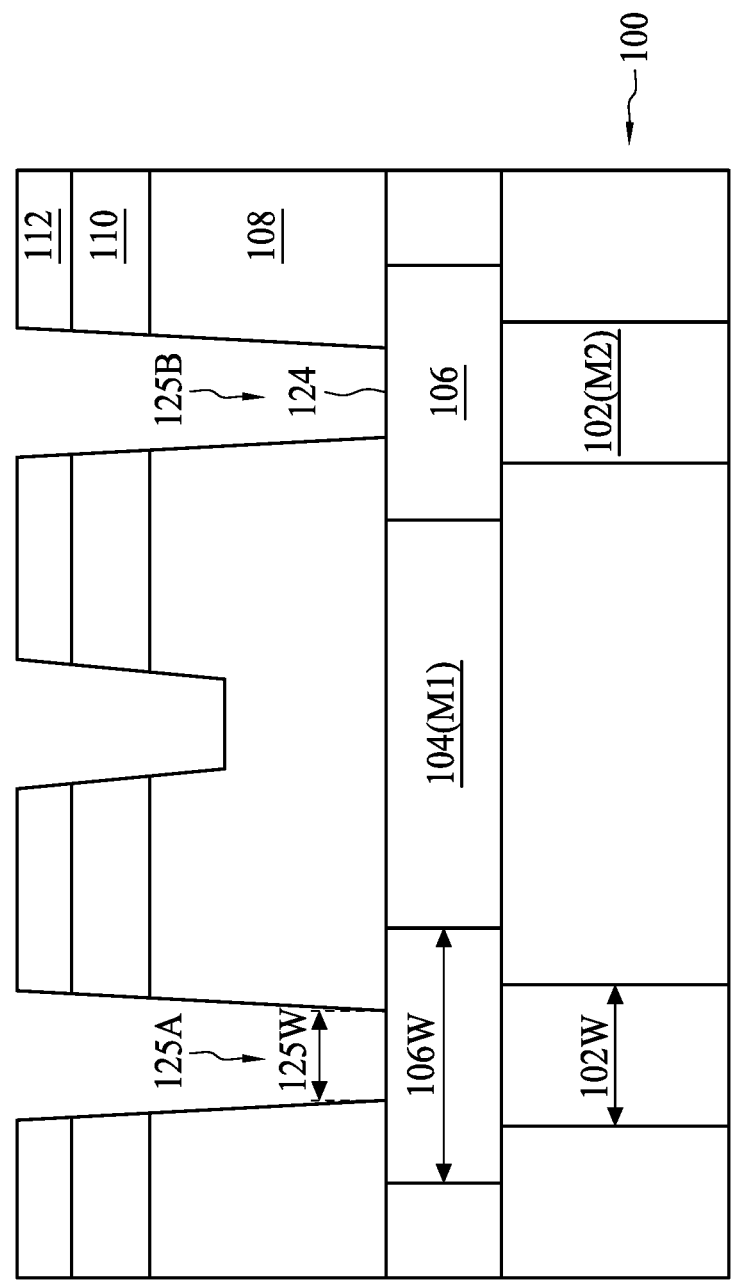

Referring to FIG. 6, the insulative layer 108 is then etched, by a wet etch or dry etch process, using the photoresist 120 as a mask. Therefore, through holes 125A and 125B are formed in the insulative layer 108. The photoresist 120, the bottom resist 116 and middle resist 118 may be stripped after transferring the pattern to the insulative layer 108.

Although two through holes and their related structures are illustrated in the figures for simplicity of explanation, the number of the through hole are not limited thereto.

In some embodiments, the insulative layer 108 is etched by the first etchant, and the diffused area 106 has a lower etch rate to the first etchant than the insulative layer 108. In some embodiments, the first etchant may be predetermined to selectively etch the insulative layer 108 without substantially etching the diffused area 106.

In some embodiments, a portion 124 of the diffused area 106 is exposed from the through holes 125A and 125B. In some embodiments, the diffused area 106 has the exposed portion 124 and a non-exposed portion surrounding the exposed portion 124.

In some embodiments, the non-diffused area of the etch stop layer 104 is not exposed. In some embodiments, the exposed portion 124 has the same width 125W as the through holes 125A and 125B. In some embodiments, the width 125W of the exposed portion 124 is narrower than the width 106W of the diffused area 106.

In some embodiments, the method 200 further includes, before step 206 (forming the diffused area 106 in the etch stop layer 104), setting the width 106W of the diffused area 106 to be wider than the width 125W of the through holes 125A and 125B (i.e., the width 125W of the exposed portion 124).

Figure 7:
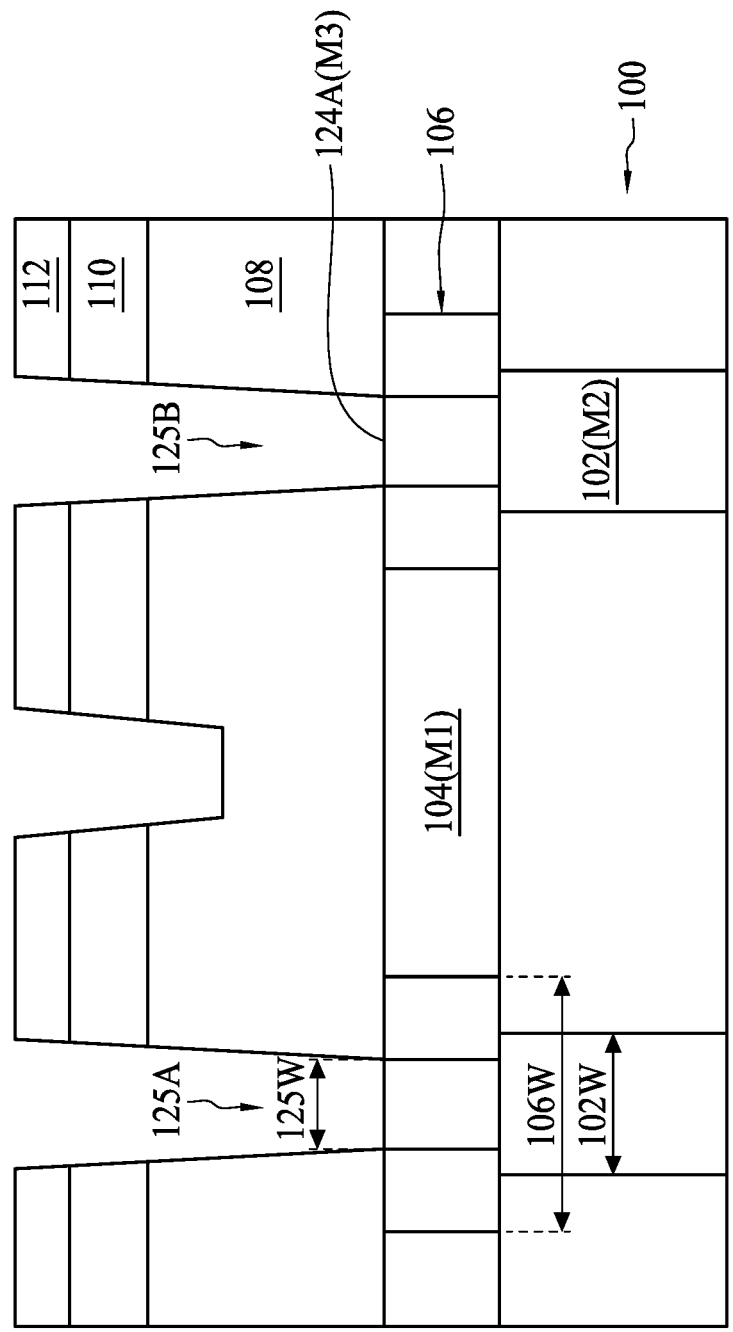

The method 200 then proceeds to step 212, transforming the exposed portion into a region. As shown in FIG. 7, the exposed portion 124 of the diffused area 106 is transformed into a region 124A by plasma, UV light, or vapor. In some embodiments, the region 124A has a material M3, which is different than the material M2 of the non-exposed portion of the diffused area 106.

In some embodiments, the region 124A has a higher etch rate to a second etchant than the non-exposed portion of the diffused area 106. The second etchant will be used to remove the region 124A in the subsequent step 214.

In some embodiments, the exposed portion 124 may be transformed by plasma generated from gas such as $C_4F_8$, $C_4F_6$, $N_2$, $O_2$, Ar, $CO_2$, $H_2$, or other suitable materials. In some embodiments, the plasma can be provided by a remote plasma generator, a capacitively coupled plasma (CCP) generator, an inductively coupled plasma (ICP) generator, or other device known in the art.

In some embodiments, the exposed portion 124 may be transformed by UV light with wavelength about 100 to 500 nm. In some embodiments, the dosage of the UV light is about 0.05 to 100 J/cm$^2$. In some embodiments, the exposed portion 124 may be transformed by utilizing mercury vapor lamp, fluorescent lamps, LEDs, tanning lamps, halogen lamps, gas-discharge lamps, excimer lamps, or other light source known in the art.

In some embodiments, the exposed portion 124 may be transformed by vapor such as $NH_3$, $H_2$, $CO_2$, or other suitable materials.

Figure 8:
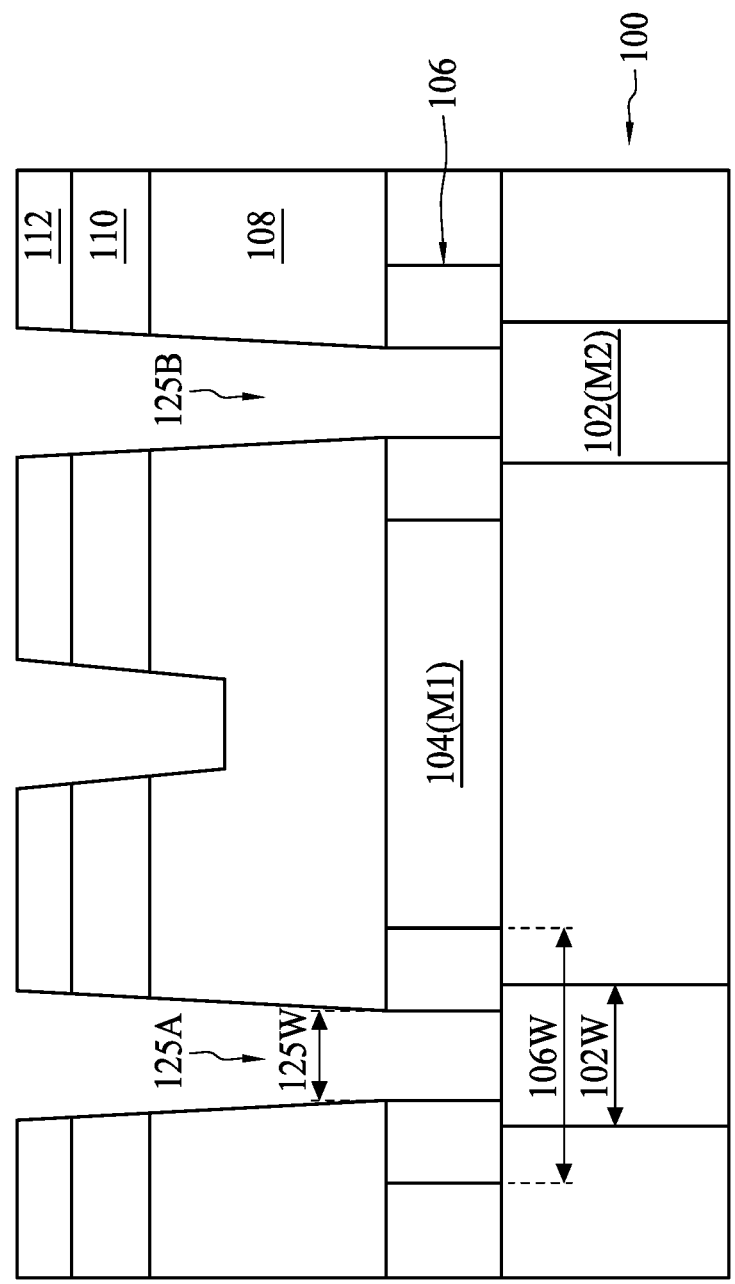

The method 200 then proceeds to step 214, removing the region. FIG. 8 illustrates removing the region 124A by the second etchant without removing the non-exposed portion of the diffused area 106.

In some embodiments, the region 124A is removed to expose the underlying metal pattern 102. In some embodiments, the through holes 125A and 125B extends from a surface of the insulative layer 108 to the metal pattern 102.

In some embodiments, an etch rate ratio of the region 124A to the non-exposed portion is at least 12. In some embodiments, an etch rate ratio of the region 124A to the non-exposed portion is at least 10. In some embodiments, the second etchant may be selected to etch the region 124A without substantially etching the non-exposed portion.

In some embodiments, the etch rate of the region 124A under the second etchant is higher than 5 Å/min. In some embodiments, the etch rate of the metal pattern 102 under the second etchant is lower than 1 Å/min. In some embodiments, the second etchant may be selected to etch the region 124A without substantially etching the metal pattern 102.

In some embodiments, the second etchant is composed of (1) alkaline amine (e.g. ammonium hydroxide ($NH_4OH$), hydroxylamine ($NH_2OH$), or other similar compound); (2) solvent (e.g. diethylene glycol monomethyl ether, ethylene glycol, butyl diethylene glycol, dimethyl sulfoxide); (3) chelator (e.g. ethylenediaminetetraacetic acid, diethylenetriaminepentaacetic acid); (4) inhibitor (e.g. BTA, dodecylamine); (5) water, and other suitable component. In some embodiments, the second etchant has a pH value about 8 to 13.

In some embodiments, the weight percentage concentration of the alkaline amine in the second etchant is not higher than 8%. In some embodiments, the weight percentage concentration of the water in the second etchant is about 20% to 80%.

In an embodiment where the material M1 of the etch stop layer 104 is aluminum oxide ($AlO_X$) and the material M2 is copper (Cu), the reactions occurred during the removing of the region 124A is illustrated as follows:

The reaction (1) between the region 124A and the second etchant:

$$2OH^- + 3H_2O + Al_2O_3 \rightarrow 2Al(OH)_{4(aq)}^- \quad (1)$$

The hydroxyl group (OH$^-$) is from the alkaline amine in the second etchant, and the aluminum oxide (Al$_2$O$_3$) is transformed from Al(Cu)O$_X$ of the diffused area.

The reaction (2) between the non-exposed portion and the second etchant:

$$OH^- + Al(Cu)O_X \rightarrow \text{No reaction} \quad (2)$$

Since there is substantially no reaction between the non-exposed portion (A/(Cu)O$_X$) and the second etchant (OH$^-$), the non-exposed portion can stay in place while the region 124A is removed.

The above chemical reactions and second etchant components are merely illustrated as examples for explanation, and can be designed for meeting requirements in accordance with the spirit of the present invention, such as avoiding lateral etching into the non-exposed portion, and mitigating loading effect.

In some embodiments, as shown in FIG. 8, after the removing of the region 124A, the through holes 125A and 125B are surrounded by the diffused area 106. In some embodiments, the through holes 125A and 125B are further surrounded by the non-diffused area of the etch stop layer 104.

Figure 9:
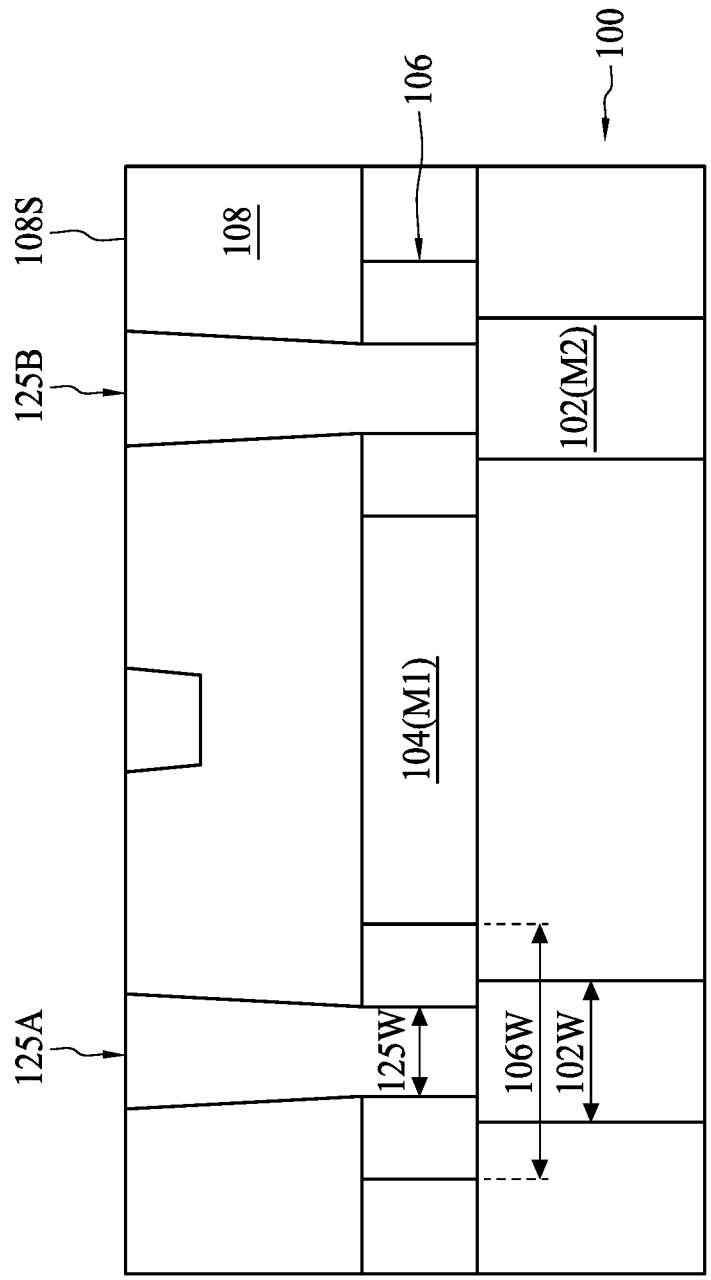
Figure 10:
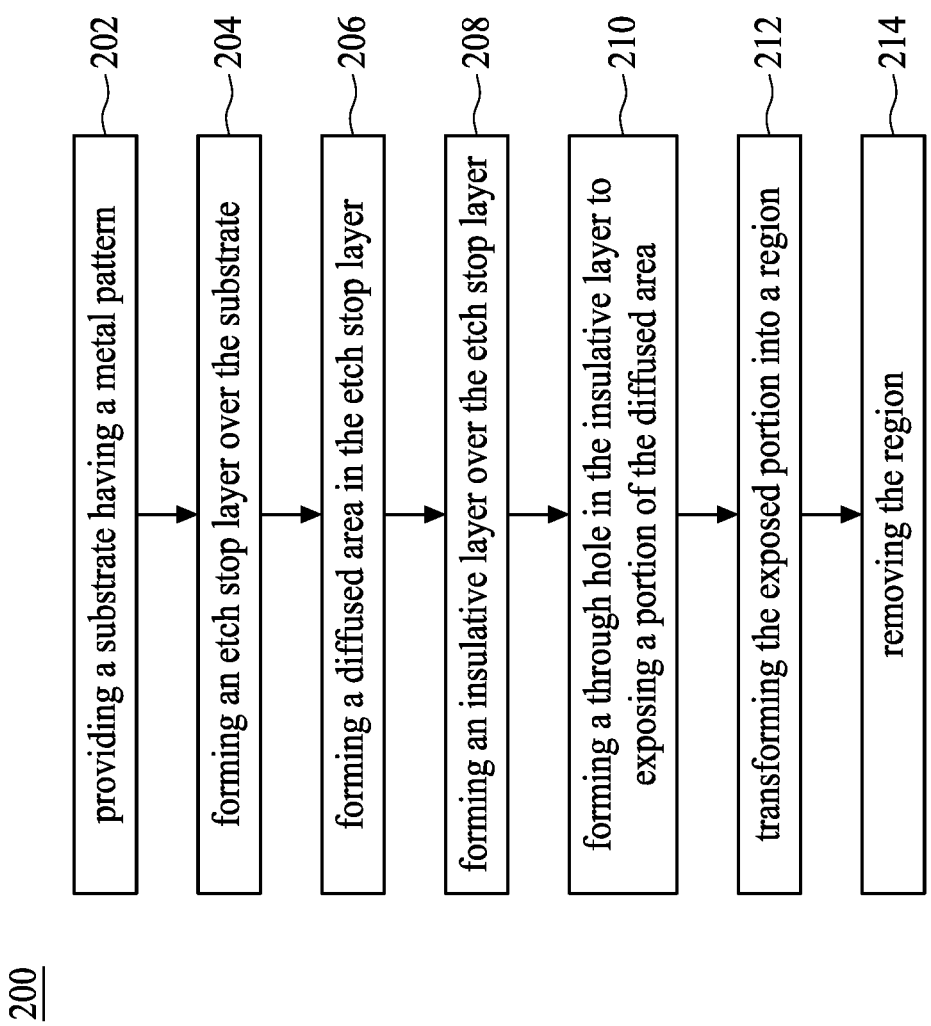
FIG. 10 is a flow chart of a method of forming a semiconductor device in accordance with some embodiments of the present disclosure.

In some embodiments, referring to FIG. 9, the method 200 further includes filling the through holes 125A and 125B with conductive material 126. The conductive material 126 electrically connected with the metal pattern 102.

In some embodiments, the conductive material 126 is surrounded by the diffused area 106. In some embodiments, the diffused area 106 contacts with the metal pattern 102 and also contacts with the conductive material 126.

In some embodiments, a polishing and/or grinding process, such as a chemical mechanical polish (CMP) may be performed to remove excess portions.

Referring to FIG. 11 to FIG. 18, FIG. 11 to FIG. 18 illustrate a method 300 of a method of forming a semiconductor device in accordance with some embodiments of the present disclosure. The processes described in FIG. 11 to FIG. 18 proceed in accordance with the steps set forth in the flow chart of FIG. 19. For simplicity of explanation, explanation of the same or similar portions to the description in FIGS. 1 to 9 is omitted herein.

Figure 11:
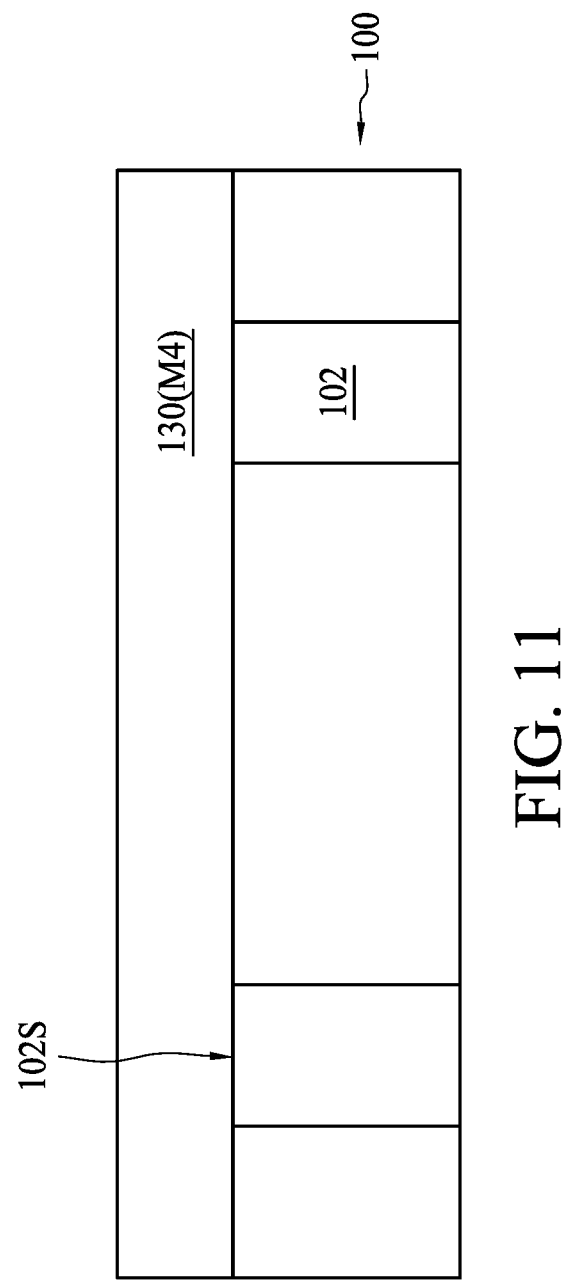
FIG. 11 to FIG. 18 illustrate a method of forming a semiconductor device in accordance with some embodiments of the present disclosure.

The method 300 begins at step 302, where a substrate having a metal pattern is provided. With reference now to FIG. 11, there is shown a cross-sectional diagram of the substrate 100 having the metal pattern 102. The identical numbers represent similar components for simplicity of explanation. Such similar components are omitted in the interest of brevity, and only the differences are provided.

The method 300 then proceeds to step 304, forming an etch stop layer over the substrate. As shown in FIG. 11, an etch stop layer 130 is formed over the substrate 100. The etch stop layer 130 contacts with the surface 102S of the metal pattern 102.

The etch stop layer 130 may have the material M1, which is mentioned above with regard to the etch stop layer 104. The etch stop layer 130 differs from the etch stop layer 104 in that the etch stop layer 130 is doped with a material M4. In various examples, the material M4 includes copper (Cu), cobalt (Co), ruthenium (Ru), tungsten (W), rhodium (Rh), titanium (Ti), tantalum (Ta), zirconium (Zr), Silicon (Si), Carbon (C) or other suitable material.

In some embodiments, the etch stop layer 130 may be deposited over the substrate 100 by PVD, CVD, ALD, thermal ALD, spin-on coating, or other method known in the art. In some embodiments, the etch stop layer 130 may be doped after deposited. In some embodiments, the pre-doped etch stop layer 130 may be deposited.

Figure 12:
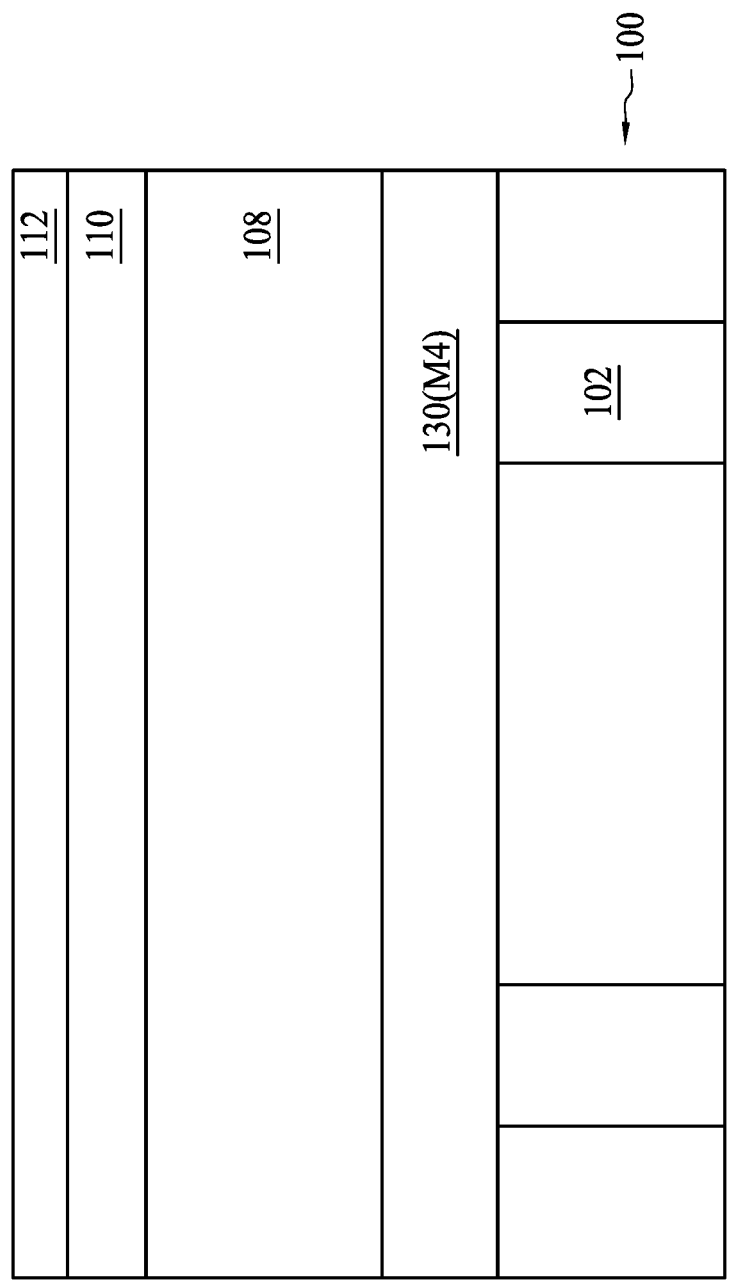
Figure 13:
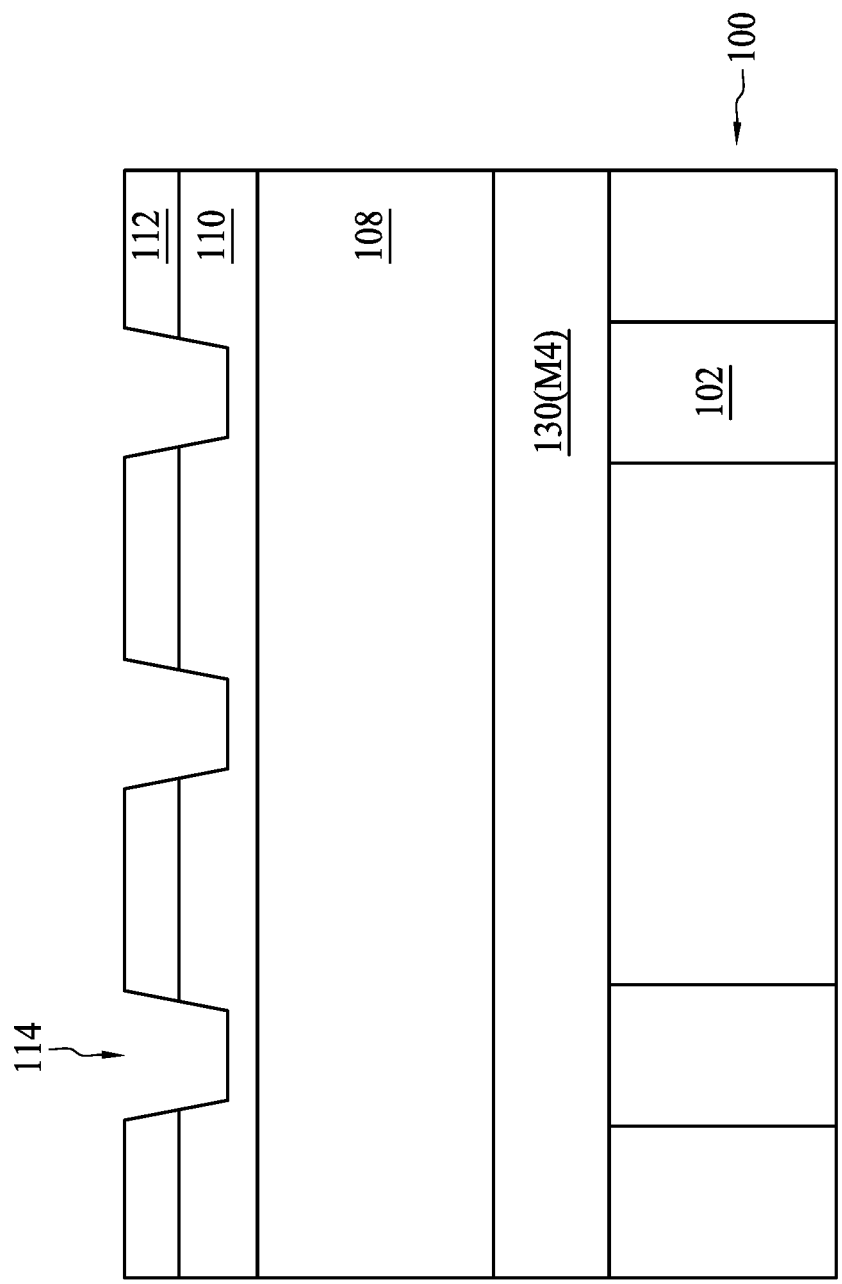

The method 300 then proceeds to step 306, forming an insulative layer over the etch stop layer. FIG. 12 illustrates the insulative layer 108 deposits over the etch stop layer 130. In some embodiments, the insulative layer 108 is patterned, as shown in FIG. 13. The detail description of the insulative layer 108 may refer to FIG. 3 and FIG. 4.

Figure 14:
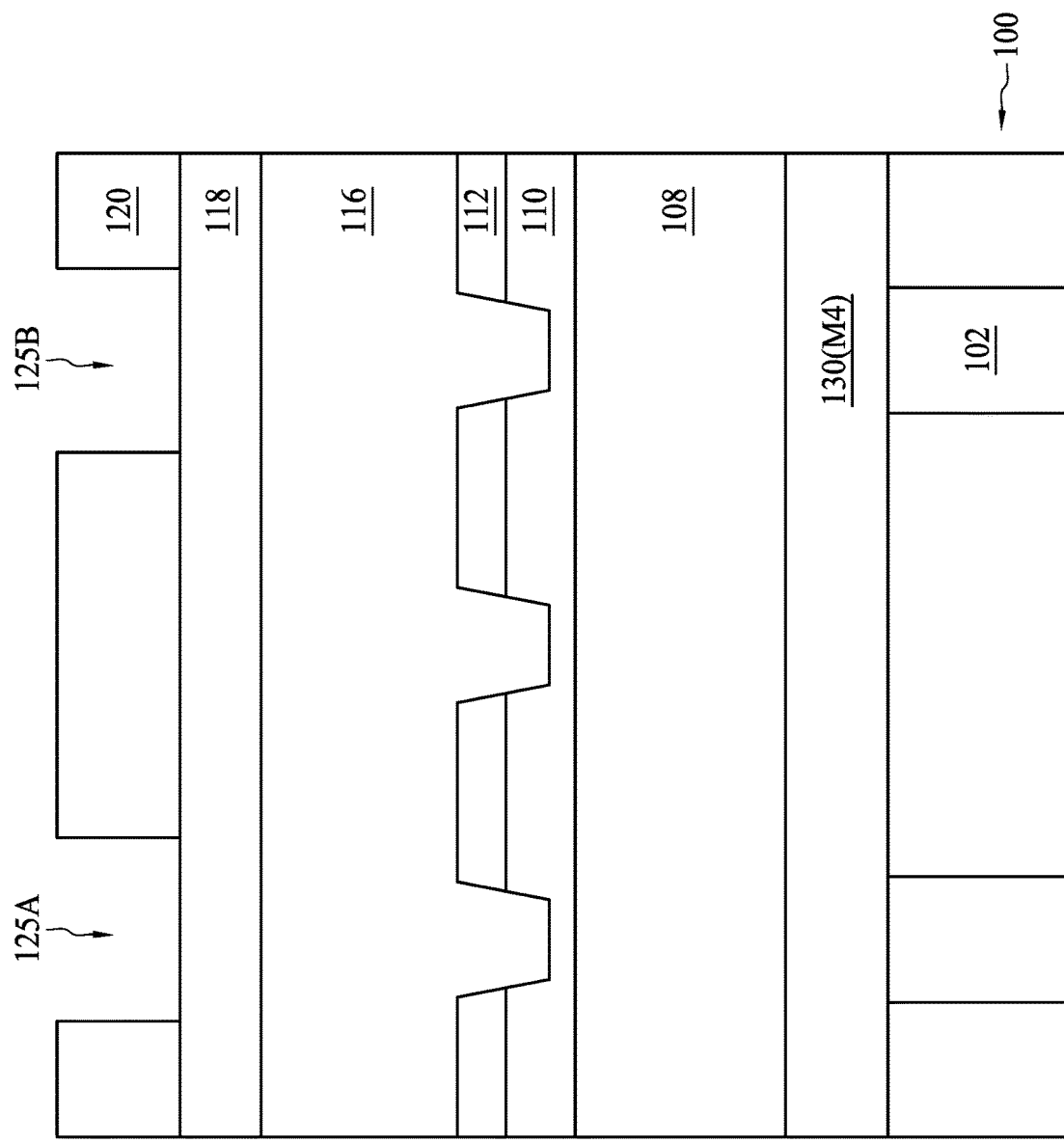

The method 300 then proceeds to step 308, forming a through hole in the insulative layer to exposing a portion of the etch stop layer. In some embodiments, as shown in FIG. 14, a photoresist 120 is formed and patterned to define the through holes 125A and 125B in the insulative layer 108.

Figure 15:
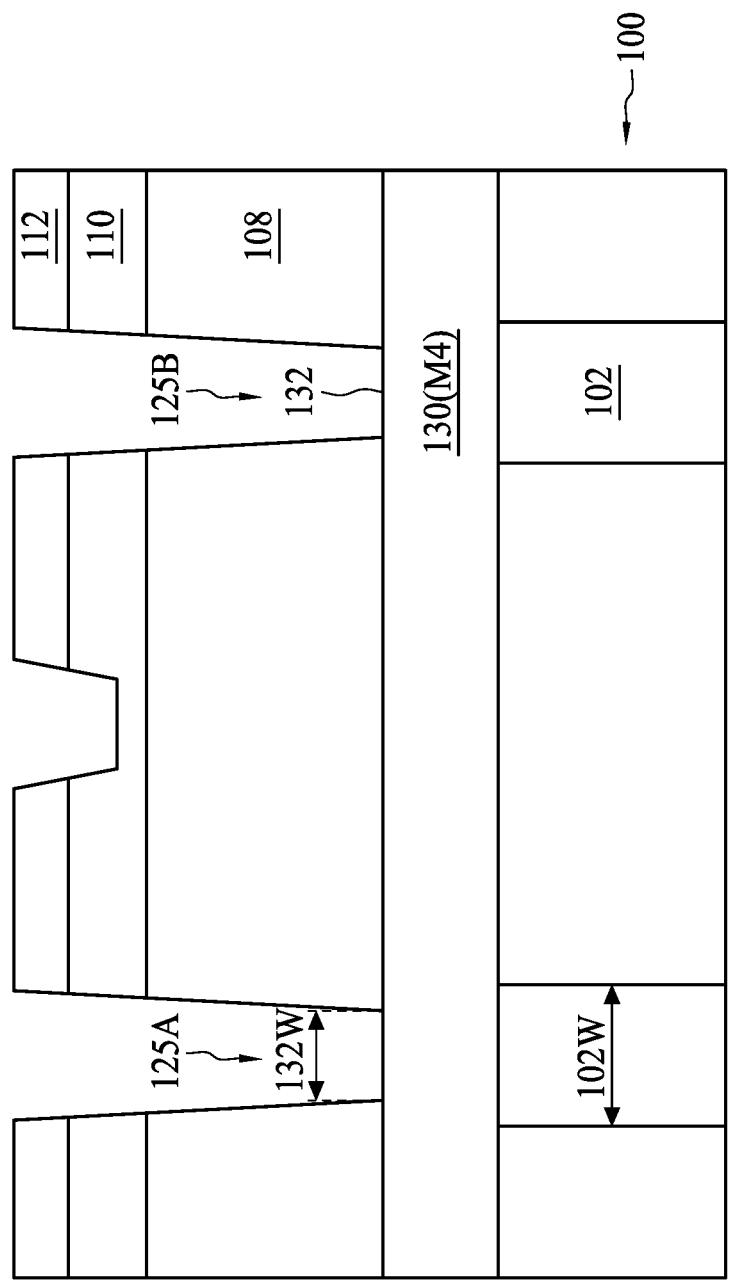

Referring to FIG. 15, the insulative layer 108 is etched, by a wet etch or dry etch process, using the photoresist 120 as a masking element. Therefore, through holes 125A and 125B are formed in the insulative layer 108. The photoresist 120, the bottom resist 116 and middle resist 118 may be stripped after transferring the pattern to the insulative layer 108.

In some embodiments, the insulative layer 108 is etched by a first etchant. The etch stop layer 130 has a lower etch rate to the first etchant than the insulative layer 108. In some embodiments, the first etchant may be predetermined to selectively etch the insulative layer 108 without substantially etching etch stop layer 130.

In some embodiments, a portion 132 of the etch stop layer 130 is exposed from the through holes 125A and 125B. In some embodiments, the exposed portion 132 has a width 132W. In some embodiments, the method 300 further includes setting the width 132W of the exposed portion 132 to be narrower than the width 102W of the metal pattern 102.

Figure 16:
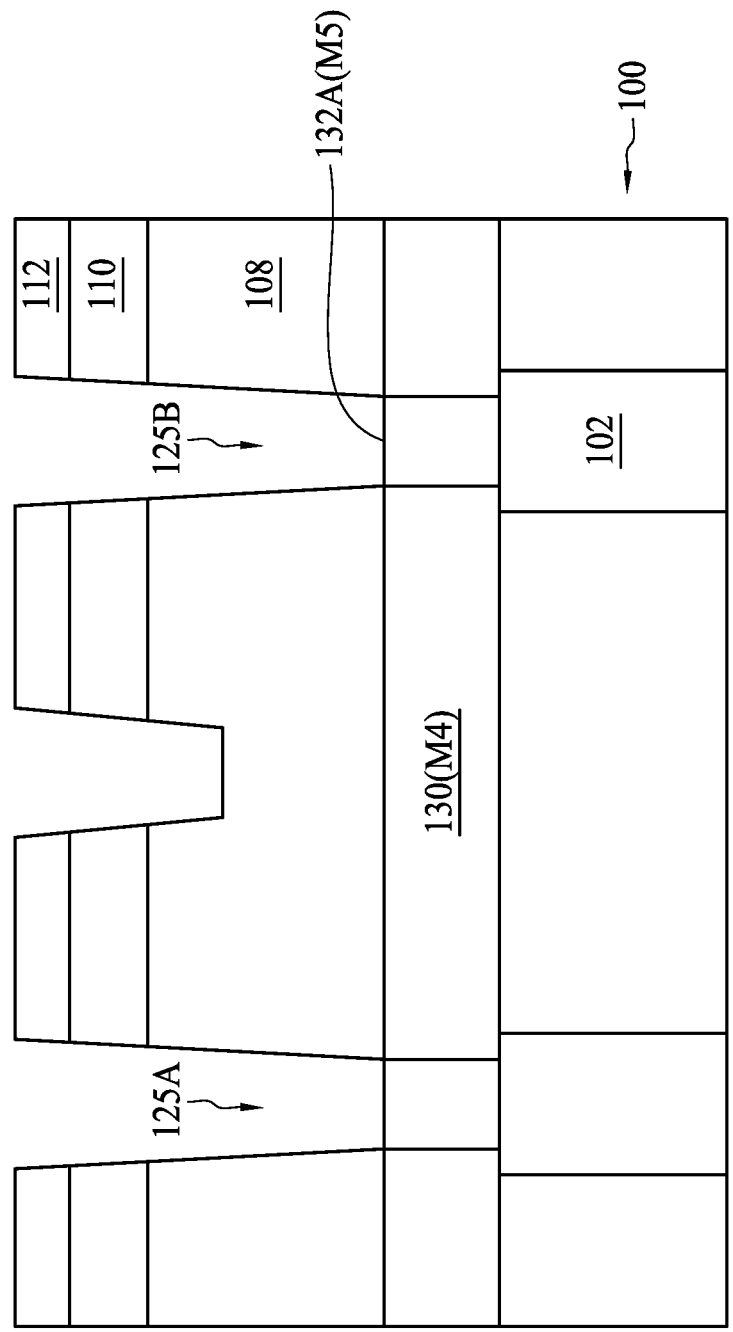

The method 300 then proceeds to step 310, transforming the exposed portion to a region. As shown in FIG. 16, the exposed portion 132 of the etch stop layer 130 is transformed into a region 132A by plasma, UV light, or vapor. In some embodiments, the region 132A has a material M5, which is different than the material of the original etch stop layer 130, which is material M1 doped with material M4.

In some embodiments, the region 132A has a higher etch rate to a second etchant than the original etch stop layer 130. The detail description of the transforming process may refer to FIG. 7.

Figure 17:
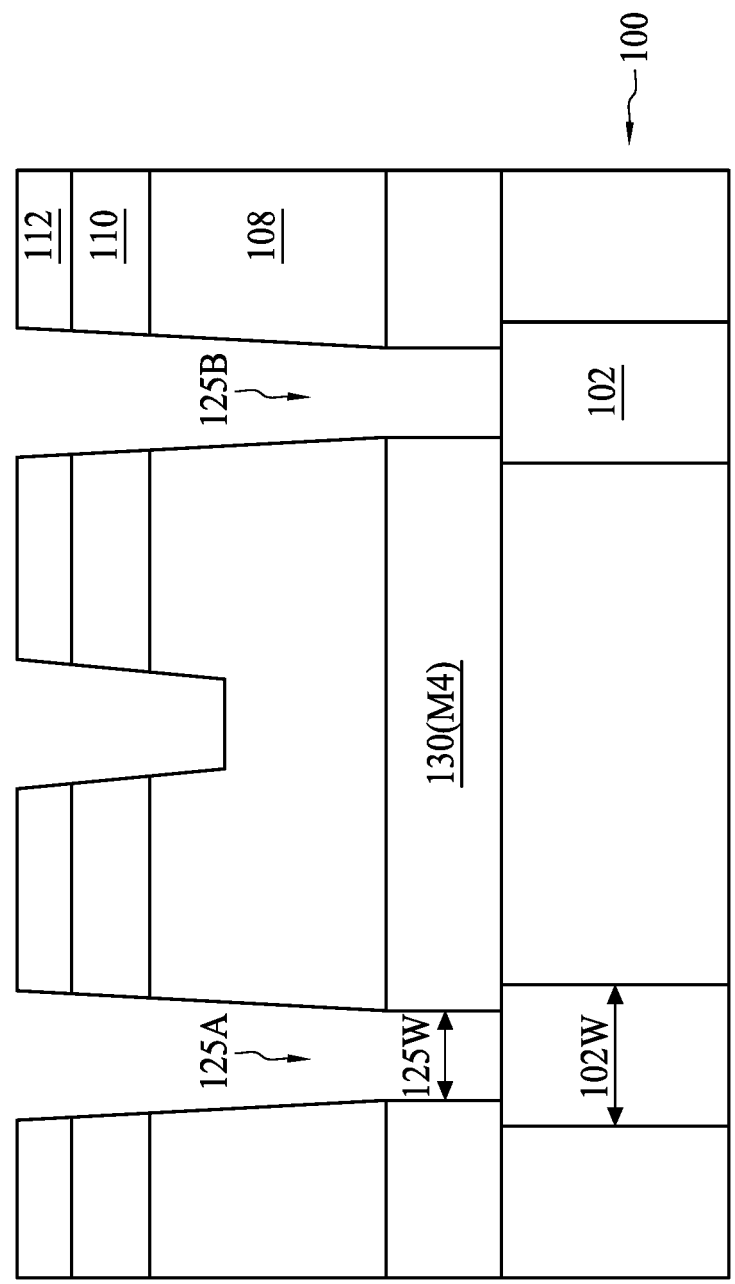

The method 300 then proceeds to step 312, removing the region. FIG. 17 illustrates removing the region 132A by the second etchant without removing the non-exposed portion of the etch stop layer 130 (i.e., the original etch stop layer 130). In some embodiments, the region 132A is removed to expose the underlying metal pattern 102.

In some embodiments, the second etchant components can be selected for avoiding lateral etching into the non-exposed portion of the etch stop layer 130, and for mitigating loading effect.

Figure 18:
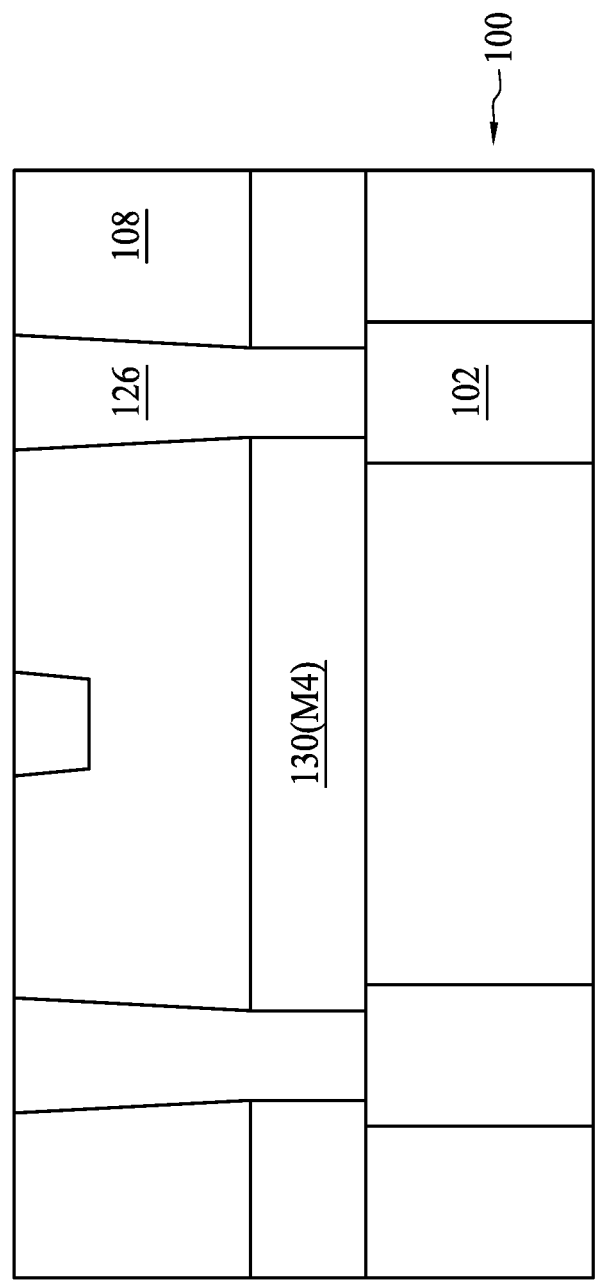
Figure 19:
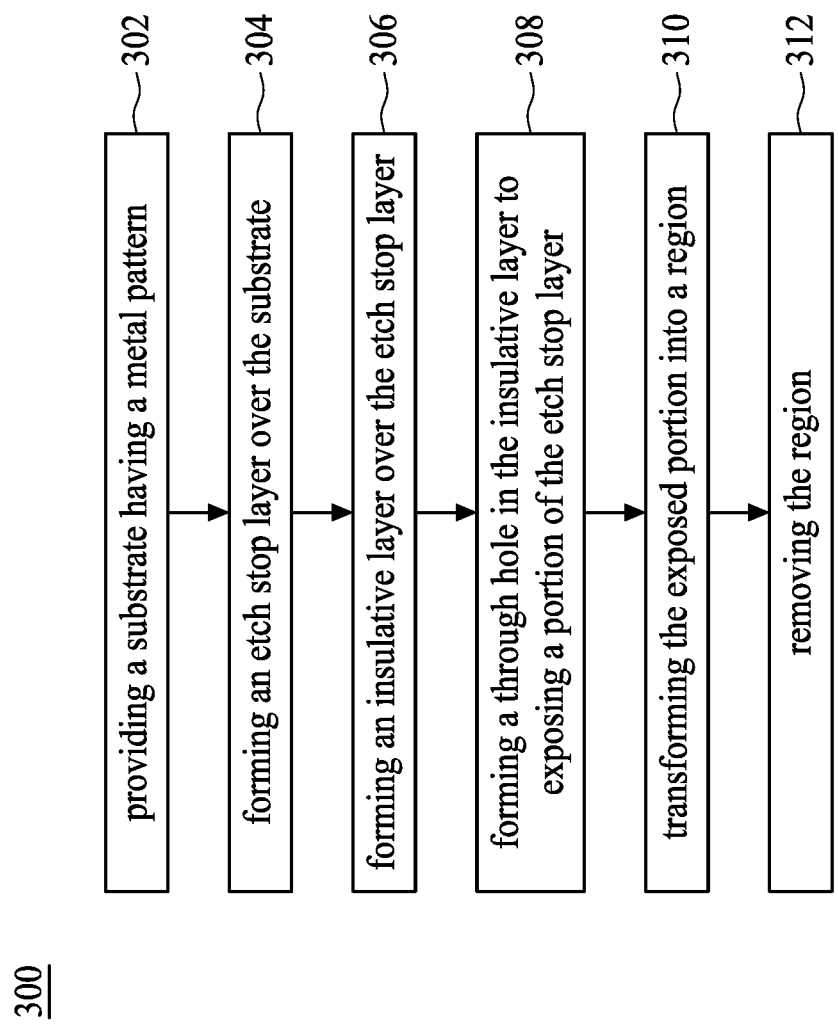
FIG. 19 is a flow chart of a method of forming a semiconductor device in accordance with some embodiments of the present disclosure.

Referring to FIG. 18, in some embodiments, the method 300 further includes filling the through holes 125A and 125B with conductive material 126. In some embodiments, the method 300 further includes removing excess portions by CMP.

Some embodiments of the present disclosure provide a method for forming a semiconductor device. The method includes providing a substrate having a metal pattern, and forming an etch stop layer over the substrate. The etch stop layer includes a first material. The method further includes forming a diffused area in the etch stop layer by diffusing a second material from the metal pattern to the etch stop layer. The method further includes forming an insulative layer over the etch stop layer. The diffused area includes a lower etch rate to a first etchant than the insulative layer.

Some embodiments of the present disclosure provide a method for forming a semiconductor device. The method includes providing a substrate having a metal pattern, and forming an etch stop layer over the substrate. The etch stop layer is doped with a doping material. The method further includes forming an insulative layer over the etch stop layer, and forming a through hole in the insulative layer with a first etchant to expose a portion of the etch stop layer. The etch stop layer has a lower etch rate to the first etchant than the insulative layer. The method further includes transforming the exposed portion of the etch stop layer into a region having a higher etch rate to a second etchant than the non-exposed portion of the etch stop layer.

Some embodiments of the present disclosure provide a semiconductor device. The semiconductor device includes: a substrate having a metal pattern; an insulative layer over the substrate; an etch stop layer between the substrate and the insulative layer; and a through hole extending from a surface of the insulative layer to the metal pattern. The etch stop layer comprises a non-diffused area and a diffused area, and the through hole is surrounded by the diffused area and further surrounded by the non-diffused area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor device, comprising:
providing a substrate having a metal pattern;
forming an etch stop layer over the substrate, wherein the etch stop layer includes a first material;
forming a diffused area in the etch stop layer by diffusing a second material from the metal pattern to the etch stop layer; and
forming an insulative layer over the etch stop layer, wherein the diffused area includes a lower etch rate to a first etchant than the insulative layer.

2. The method of claim 1, wherein forming the diffused area in the etch stop layer comprises:
treating the metal pattern with ultraviolet light or heat.

3. The method of claim 1, further comprising:
forming a through hole in the insulative layer with the first etchant, thereby exposing a portion of the diffused area without exposing any non-diffused area in the etch stop layer.

4. The method of claim 3,
further comprising filling the through hole with a conductive material.

5. The method of claim 3, further comprising:
transforming the exposed portion of the diffused area into a region having a higher etch rate to a second etchant than the non-exposed portion of the diffused area.

6. The method of claim 5, wherein transforming the exposed portion comprises:
treating the exposed portion by plasma, UV light or vapor.

7. The method of claim 5, further comprising:
removing the region by the second etchant without removing the non-exposed portion of the diffused area.

8. A method for forming a semiconductor device, comprising:
providing a substrate having a metal pattern;
forming an etch stop layer over the substrate, wherein the etch stop layer is doped with a doping material;
forming an insulative layer over the etch stop layer;
forming a through hole in the insulative layer with a first etchant to expose a portion of the etch stop layer, wherein the etch stop layer has a lower etch rate to the first etchant than the insulative layer; and
transforming the exposed portion of the etch stop layer into a region having a higher etch rate to a second etchant than the non-exposed portion of the etch stop layer.

9. The method of claim 8, wherein transforming the exposed portion comprises:
treating the exposed portion by plasma, UV light or vapor.

10. The method of claim 8,
further comprising filling the through hole with a conductive material.

11. The method of claim 8, further comprising:
removing the region by the second etchant without removing the non-exposed portion of the etch stop layer.

12. The method of claim 8, wherein an etch rate ratio of the region to the non-exposed portion is at least 10.

13. A semiconductor device, comprising:
a substrate having a metal pattern;
an insulative layer over the substrate;
an etch stop layer between the substrate and the insulative layer; and
a through hole extending from a surface of the insulative layer to the metal pattern;
wherein the etch stop layer comprises a non-diffused area and a diffused area, and the through hole is surrounded by the diffused area and further surrounded by the non-diffused area.

14. The semiconductor device of claim 13, wherein the etch stop layer comprises aluminum oxide.

15. The semiconductor device of claim 13, wherein the diffused area comprises a material existing in the metal pattern and the non-diffused area is free from the material.

16. The semiconductor device of claim 13, wherein the through hole is filled with a conductive material, and the conductive material is surrounded by the diffused area.

17. The semiconductor device of claim 16, wherein the diffused area contacts with the metal pattern and the conductive material.

18. The semiconductor device of claim 16, wherein the diffused area has a lower etch rate to an etchant used to form the through hole than the non-diffused area.

19. The semiconductor device of claim 16, wherein the etch stop layer comprises two diffused areas separated by the non-diffused area.

20. The semiconductor device of claim 16, wherein the diffused area includes a width wider than a width of the metal pattern.

* * * * *